(12) United States Patent
Ganz et al.

(10) Patent No.: US 10,374,138 B2
(45) Date of Patent: Aug. 6, 2019

(54) THERMOELECTRIC GENERATOR, IN PARTICULAR FOR A MOTOR VEHICLE

(71) Applicant: Mahle International GmbH, Stuttgart (DE)

(72) Inventors: Matthias Ganz, Stuttgart (DE); Stefan Hirsch, Stuttgart (DE); Christopher Laemmle, Stuttgart (DE); Volker Schall, Hemmingen (DE)

(73) Assignee: Mahle International GmbH (DE)

( * ) Notice: Subject to any disclaimer, the term of this patent is extended or adjusted under 35 U.S.C. 154(b) by 123 days.

(21) Appl. No.: 15/708,096

(22) Filed: Sep. 18, 2017

(65) Prior Publication Data

US 2018/0083180 A1 Mar. 22, 2018

(30) Foreign Application Priority Data

Sep. 19, 2016 (DE) .................. 10 2016 217 894

(51) Int. Cl.
*H01L 35/32* (2006.01)
*H01L 35/02* (2006.01)

(52) U.S. Cl.
CPC .............. *H01L 35/32* (2013.01); *H01L 35/02* (2013.01)

(58) Field of Classification Search
CPC ......... H01L 35/30; H01L 35/32; H01L 35/34; H01L 35/325; F01N 5/025; F28D 9/0043;
(Continued)

(56) References Cited

U.S. PATENT DOCUMENTS 8,881,513 B2 11/2014 Bruck et al.
2013/0309798 A1 11/2013 Gille et al.

FOREIGN PATENT DOCUMENTS

DE 102008023937 A1 11/2009
EP 2960953 A1 12/2015
WO WO-2007026432 A1 * 3/2007 ............. F01N 5/025

OTHER PUBLICATIONS

English machine translation of WO 2007/026432 A1 provided via the WIPO website. (Year: 2019).*
German Search Report for DE-102016217894.6, dated Aug. 24, 2017.

* cited by examiner

*Primary Examiner* — Devina Pillay
*Assistant Examiner* — Daniel P Malley, Jr.
(74) *Attorney, Agent, or Firm* — Fishman Stewart PLLC

(57) ABSTRACT

A thermoelectric generator for a motor vehicle may include a housing. The housing may define a housing interior space. An outer thermal insulation may be arranged in the housing interior space. The outer thermal insulation may at least partially envelope an insulation interior space. A plurality of first stack discs and a plurality of second stack discs may be alternately stacked along a stack direction within the insulation interior space. The alternately stacked plurality of first stack discs and second stack discs may form a plurality of stack disc pairs. Each of the plurality of stack disc pairs may include a first stack disc and a second stack disc. The first stack disc and the second stack disc may define a gas flow path. At least one tube body may be positioned within at least one intermediate space defined between at least a first stack disc pair of the plurality of stack disc pairs and a second stack disc pair of the plurality of stack disc pairs adjacent to the first stack disc pair in the stack direction. The at least one tube body may define a coolant flow path. The at least one first stack disc pair may be in fluid communication with the at least one second stack disc pair via at least one connecting gas flow path. A thermoelectric module having at least one thermoelectrically active element may be disposed within the at least one intermediate space between the gas flow path and the coolant flow path. The thermo- (Continued)

electric module may include a hot side in thermal contact with the gas flow path and a cold side in thermal contact with the coolant flow path. An inner thermal insulation having at least one thermal insulation element may be disposed within the insulation interior space. The inner thermal insulation may be constructed and arranged to thermally insulate the gas flow path relative to the coolant flow path.

20 Claims, 2 Drawing Sheets

(58) Field of Classification Search
CPC ...... F28D 9/0056; F28F 3/025; F02B 29/046; Y02T 10/16; Y02T 10/148; Y02T 10/166
See application file for complete search history.

US 10,374,138 B2

THERMOELECTRIC GENERATOR, IN PARTICULAR FOR A MOTOR VEHICLE

CROSS-REFERENCE TO RELATED APPLICATIONS

This application claims priority to German Patent Application No.: DE 10 2016 217 894.6 filed on Sep. 19, 2016, the contents of which are incorporated herein by reference.

TECHNICAL FIELD

The invention relates to a thermoelectric generator, in particular for a motor vehicle.

BACKGROUND

The term "thermoelectricity" is to mean the mutual influencing of temperature and electricity and their conversion into one another. As thermoelectric generators, thermoelectric modules each with a plurality of thermoelectrically active elements utilise this influencing in order to generate electric energy from waste heat. Said thermoelectric elements, for this purpose, consist of thermoelectric semiconductor materials which convert a temperature difference into a potential difference, i.e. into an electric voltage. In this way, a heat flow can be converted into an electric current. The thermoelectric modules are based on the Seebeck effect. Within a thermoelectric module, P-doped and N-doped thermoelectric elements are interconnected. Usually, a plurality of such thermoelectric modules is interconnected to form a thermoelectric generator, which can generate an electric current from a temperature difference in conjunction with a corresponding heat flow. In this process it is highly important to achieve as high as possible an efficiency in order to convert heat into electric energy as effectively as possible.

SUMMARY

It is therefore an object of the present invention to show new ways in the development of thermoelectric generators. In particular, a thermoelectric generator is to be created which has a particularly high efficiency.

This object is solved through the subject of the independent patent claims. Preferred embodiments are subject of the dependent patent claims.

Accordingly, the basic idea of the invention is to equip a thermoelectric generator with an outer and an inner thermal insulation by means of which the efficiency of the thermoelectric generator is improved. Said inner thermal insulation causes the coolant paths flowed through by a coolant to be thermally insulated as completely as possible from the gas paths flowed through by the hot gas. In this way, it is ensured that between the hot sides and the cold sides of the thermoelectric modules as great as possible a temperature difference is retained. Here, undesirable heat bridges between the gas paths flowed through by the hot gas and the coolant paths flowed through by the coolant of lower temperature are avoided by means of the inner thermal insulation.

In analogous manner, the coolant paths—including their connections for conducting the coolant in and out, which can be provided outside on the housing of the thermoelectric generator—are thermally insulated from the gas paths with the help of an outer thermal insulation.

Both measures described before, i.e. providing an outer and an inner thermal insulation, lead to an improved efficiency of the thermoelectric generator for the same reasons as described before for the inner thermal insulation.

A thermoelectric generator according to the invention, in particular for a motor vehicle, comprises a housing which delimits a housing interior space. In the housing interior space, an outer thermal insulation consisting of at least one thermally insulating material is arranged, which at least partly envelopes an insulation interior space. The thermoelectric generator comprises a plurality of first and second stack discs which along a stack direction are alternately stacked on top of one another and which are arranged in the insulation interior space for being flowed through by a gas. In each case a first stack disc and a second stack disc which with respect to this first stack disc is adjacent in the stack direction from a stack disc pair which delimits a gas path for being flowed through by the gas. In at least one intermediate space between two adjacent stack disc pairs, a coolant path for being flowed through by a coolant is present, which is delimited by a tube body. Two stack disc pairs adjacent in the stack direction communicate with one another by means of at least one connecting gas path fluidically separately to the respective intermediate space between the two stack disc pairs. In the at least one intermediate space between a gas path and a coolant path at least one thermoelectric module with at least one thermoelectrically active element is arranged. The at least one thermoelectric module has a hot side which is thermally in contact with the gas path and a cold side which is thermally in contact with the coolant path.

In the insulation interior space, an inner thermal insulation consisting of at least one thermally insulating material for the thermal insulation of the gas paths relative to the coolant paths is additionally arranged, which comprises at least one thermal insulation element.

According to a preferred embodiment, the outer thermal insulation comprises mouldings which are substantially formed plate-like. Such mouldings can be produced in a technically simple and thus cost-effective manner and can be easily adapted to the geometrical circumstances of the gas paths and of the coolant paths in the insulation interior space.

In an advantageous further development, the outer thermal insulation, in a longitudinal section along the stack direction, substantially has the geometry of a rectangle, wherein two mouldings form the longitudinal sides of the rectangle and two further mouldings form the two transverse sides of the rectangle. In this way, a largely complete enveloping of the insulation interior space and thus a very good thermal tuning relative to the outer surroundings can be achieved.

Practically, the two mouldings forming the longitudinal sides can be arranged outside on a first stack disc facing the housing and outside on a second stack disc facing the housing and located opposite the first stack disc in stack direction. In this way, the mouldings can be fixed on the stack discs in a mechanically stable manner.

In an advantageous further development, the at least one thermal insulation element of the inner thermal insulation is arranged with respect to the stack direction in the interior space between two adjacent stack disc pairs. With respect to a first longitudinal extension direction running transversely to the stack direction, the at least one thermal insulation element is arranged between a connecting gas path connecting two adjacent stack disc pairs and a coolant path that is adjacent to this connecting gas path in the first longitudinal extension direction.

Preferably, the material of the outer and/or inner thermal insulation comprises mineral fibers with fillers which have a high temperature resistance and heat conduction-inhibiting properties. Because of this, the effect of the outer or inner thermal insulation can be optimised. However, alternatively or additionally to said mineral fibers, other suitable materials with which the person skilled in the art is familiar and which have a high temperature resistance and heat conduction-inhibiting properties are possible.

Particularly practically, the thermal insulation elements of the inner thermal insulation can be formed as mouldings, in particular as identical parts. Such mouldings can be produced particularly easily and can be easily matched to the geometrical circumstances of the components of the thermoelectric generator. This equals in a high effectiveness of the insulation and cost advantages. This applies in particular when two or more of the mouldings are designed as identical parts.

Practically, an inner insulation element is arranged between each coolant path arranged in an intermediate space and the connecting gas path arranged in the same intermediate space. In this way, the insulating effect brought about by the inner thermal insulation can be maximised.

According to another preferred embodiment, the housing comprises a first housing wall and a second housing wall located opposite the first housing wall. In this embodiment, a first reinforcing plate is arranged on the first housing wall inside and a second reinforcing plate on the second housing wall inside. Between the first reinforcing plate and the outer thermal insulation and between the second reinforcing plate and the outer thermal insulation a preloading device for exerting a preload force on the thermoelectric modules is present in each case. By means of such a preload force it is ensured that between the gas paths or the coolant paths and the thermoelectric modules a continually high mechanical contact is created so that a highly effective thermal interaction is also ensured. By means of the preloading device, in particular thermally induced expansion effects in the material of the stack disc pairs, which form the gas paths, or of the tube bodies, which form the coolant paths, can be counteracted. In particular, the undesirable formation of intermediate spaces between the thermoelectric modules and the stack disc pairs or the tube bodies can be counteracted.

In an advantageous further development, the preloading device comprises at least one first preloading element which supports itself at one end on the first reinforcing plate and at the other end on the outer thermal insulation. Alternatively or additionally, the preloading device in this version comprises at least one second preloading element which supports itself at one end on the second reinforcing plate and at the other end on the outer thermal insulation. By means of such preloading elements, the desired preload force acting on the thermoelectric modules can be effectively generated.

A further advantageous further development of the invention, in which the first preloading element and/or the second preloading element is a resilient element which is preferably formed as disc spring or leaf spring proves to be particularly simple to realise in terms of design and thus cost-effective.

Particularly preferably, at least two first preloading elements can be provided, which with respect to a first lateral plane are arranged perpendicularly to the stack direction adjacent to one another in the region of the thermoelectric modules. Alternatively or additionally, at least two first preloading elements can be provided with this version, which with respect to a second lateral plane are arranged perpendicularly to the stack direction in the region of the thermoelectric modules.

According to another preferred embodiment, the thermoelectric generator comprises a gas inlet fluidically communicating with the gas paths for conducting the gas into the gas paths. Furthermore, the thermoelectric generator comprises a gas outlet fluidically communicating with the gas paths for conducting the gas out of the gas paths.

In an advantageous further development, the gas inlet comprises an inlet tube body, which projects from a first stack disc facing the first reinforcing plate towards the first housing wall, which engages through apertures formed in the first reinforcing plate and in the first housing wall and projects out of the housing interior space. Alternatively, the gas outlet comprises an outlet tube body which projects from a second stack disc facing the second reinforcing plate towards the second housing wall, engages through apertures formed in the second reinforcing plate and in the second housing wall and projects out of the housing interior space.

Further important features and advantages of the invention are obtained from the subclaims, from the drawings and from the associated figure description by way or the drawings.

It is to be understood that the features mentioned above and still to be explained in the following cannot only be used in the respective combination stated but also in other combinations or by themselves without leaving the scope of the present invention.

Preferred exemplary embodiments of the invention are shown in the drawings and are explained in more detail in the following description, wherein same reference characters relate to same or similar or functionally same components.

BRIEF DESCRIPTION OF THE DRAWINGS

Exemplary illustrations are described in detail by referring to the drawings as follows.

DETAILED DESCRIPTION OF THE DRAWINGS

Figure 1:
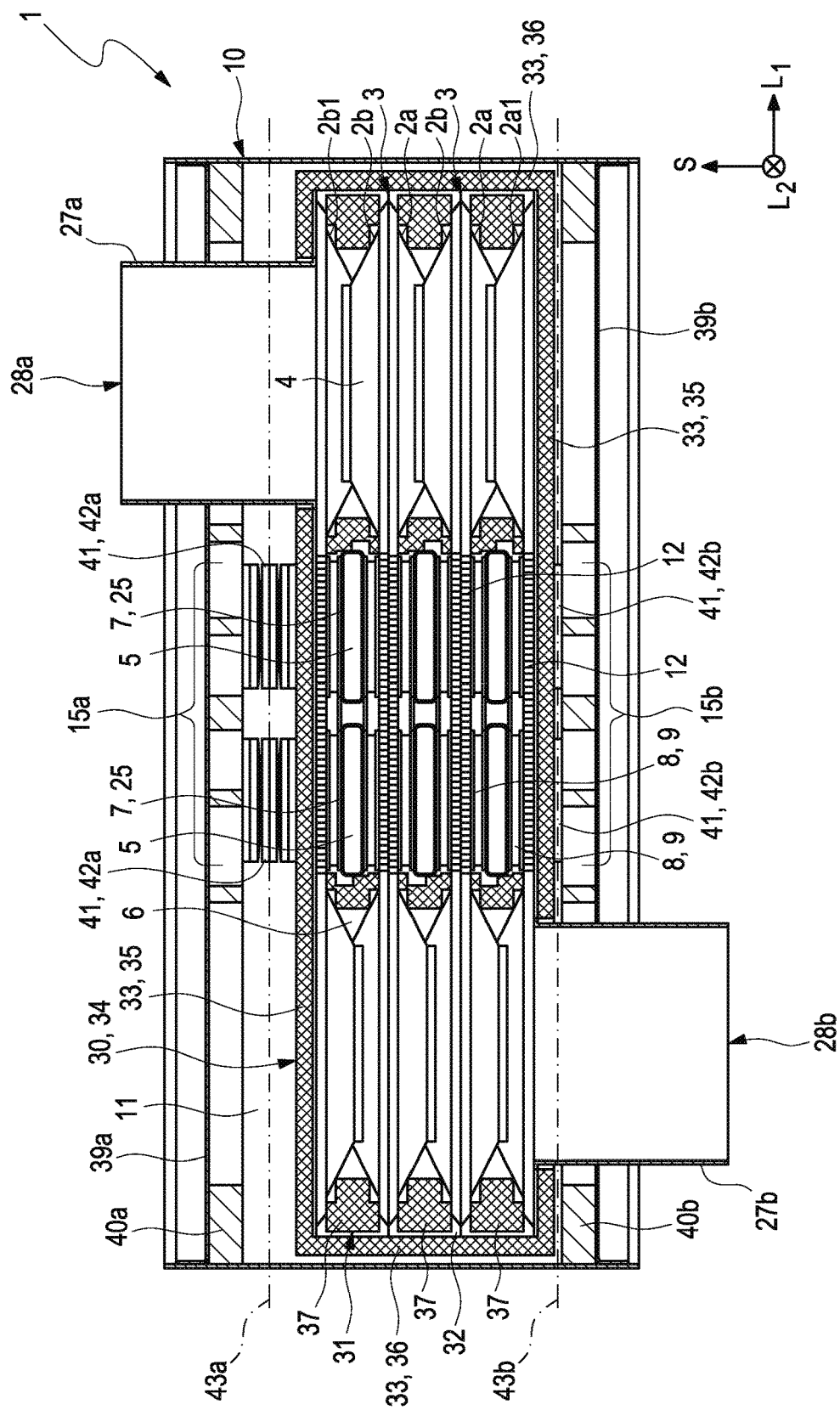
FIG. 1 illustrates an example of a thermoelectric generator according to the invention in a longitudinal section.

FIG. 1 shows an example of a thermoelectric generator 1 in a longitudinal section. According to FIG. 1, the thermoelectric generator 1 comprises a plurality of first and second stack discs 2*a*, 2*b* alternatively stacked onto one another along a stack direction S, which in each case are formed shell-like. A stack disc pair 3 each consisting of a first and a second stack disc 2*a*, 2*b* delimit a gas path 4, which can be flowed through by a gas. The first and the second stack disc 2*a*, 2*b* of a respective stack disc pair 3 are formed as half shells, which for limiting the gas path 4 face one another. The FIG. 1 shows the thermoelectric generator 1 in a longitudinal section along the stack direction S. The FIG. 2 shows the thermoelectric generator 1 of the FIG. 1 in a detail representation in the region of three stack disc pairs 3 in a perspective view.

Figure 2:
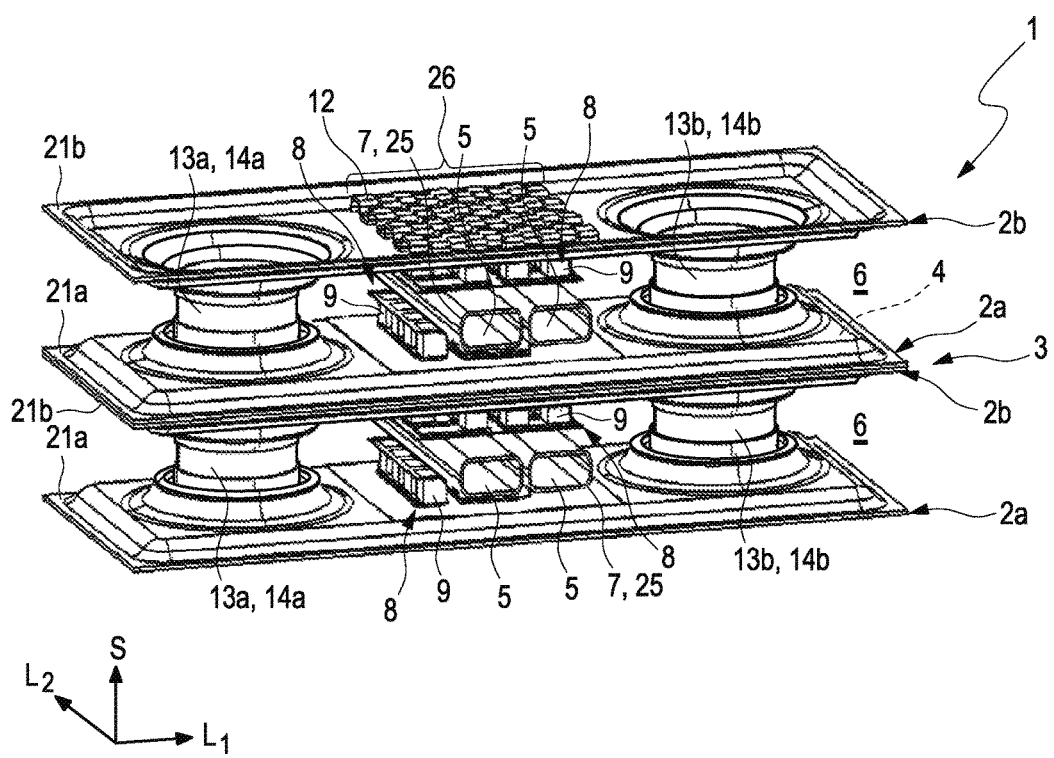
FIG. 2 illustrates a detailed representation of FIG. 1 in the region of three stack disc pairs.

The first and second stack discs 2*a*, 2*b* can each have a circumferential edge 21*a*, 21*b* projecting in stack direction S (see FIG. 2). In this way, the first stack disc 2*a* and the second stack disc 2*b* of a respective stack disc pair 3 can be particularly easily connected to one another in a firmly bonded manner, in particular by means of soldering, for forming a respective gas path 4. Between the first and the second stack disc 2*a*, 2*b* of a respective stack disc pair 3 a rib structure 12 can be arranged according to FIGS. 1 and 2, which supports itself on the first and on the second stack disc 2*a*, 2*b*. The rib structure 12 serves for mechanically stiffening the stack disc pair 3 concerned. At the same time, the ribs 12 can act as turbulence generating elements for the gas flowing through the gas path 4.

In the intermediate spaces 6 between two gas paths 4 adjacent in stack direction S, coolant paths 5 are arranged according to the FIGS. 1 and 2, which—fluidically separated from the gas paths 4—can be flowed through by a coolant. The coolant paths are delimited by respective tube bodies 7. In the intermediate spaces 6 between the gas paths 4 and the coolant paths 5 thermoelectric modules 8 with thermoelectrically active elements 9 are also arranged. In the example scenario, two thermoelectric modules 8 are provided in each intermediate space 6, but in versions, another number of thermoelectric modules 8 is obviously also conceivable.

The gas paths 4 are flowed through by gas with a temperature having a higher value than a temperature of the coolant flowing through the coolant paths 5. The hot sides of the thermoelectric modules 8 are thermally connected to the gas path 4 adjacent in stack direction S in the form of a stack disc pair 3. The cold sides of the thermoelectric modules 8 are thermally connected to the coolant path 5 adjacent in stack direction S in the form of a tube body 7. Through the temperature difference that is created between hot side and cold side an electric voltage is generated by the thermoelectric elements 9 of the thermoelectric modules 8.

As is evident from FIG. 2, the gas paths are formed longitudinally—their duct length thus amounts to at least three times, preferentially at least five times their duct width—and extend along a first longitudinal extension direction $L_1$. From FIG. 2 it is evident, furthermore, that between two thermoelectric modules 8 adjacent in stack direction S two coolant paths 5 or tube bodies 7 each are arranged, which are arranged along the first longitudinal extension direction $L_1$—i.e. transversely to the stack direction S—adjacently to and spaced from one another. In versions, another number of coolant paths 5 or tube bodies 7 can also be provided.

The coolant paths 5, just like the gas paths 4, are designed longitudinally their—duct length thus amounts to at least three times, preferentially at least five times their duct width—and extend along a second longitudinal extensions direction $L_2$, which runs transversely to the first longitudinal extension direction $L_1$ and transversely to the stack direction S. The tube bodies 7 forming the coolant paths 5 can be preferably formed as flat tubes 25, the tube height of which measured along the stack direction S amounts to a maximum of a fifth, preferentially a maximum of a tenth of a tube width measured transversely to the tube height.

Between the thermoelectric modules 8 and the gas paths 4 as well as between the thermoelectric modules 8 and the coolant paths 5 an electrical insulation of an electrically insulating material, for example in the form of an insulation layer made of plastic, can be arranged sandwich-like. The same can be applied to the stack disc 2a, 2b or the tube body 7 in a firmly bonded manner.

The above mentioned rib structure 12 is preferentially arranged laterally, i.e. in a plane perpendicularly to the stack direction S, substantially in the same region 26 as the thermoelectrically active elements 9 of the thermoelectric modules 8.

According to the FIGS. 1 and 2, two stack disc pairs 3 adjacent in the stack direction S are fluidically connected to one another by means of two connecting gas paths 13a, 13b (see FIG. 2) arranged spaced from one another. Such a connecting path 13a, 13b can be delimited by a connecting tube body 14a or 14b as shown in FIG. 2.

In the following, the attention is again directed at the representation of FIG. 1. According to FIG. 1, the thermoelectric generator 1 comprises a housing 10, which delimits a housing interior space 11. In the housing interior space 11 an outer thermal insulation 30 consisting of at least one thermally insulating material is arranged, which in turn envelopes an insulation interior space 32.

The outer thermal insulation 30 comprises a plurality of mouldings 33, which are preferably designed substantially plate-like. In versions of the example, individual mouldings 33 or all mouldings 33 however can also have a different geometrical shape. The material of the outer thermal insulation 30 comprises mineral fibers with fillers, which have a high temperature resistance and heat conduction-inhibiting properties. In versions, other suitable materials are alternatively or additionally also conceivable, which have a high temperature resistance and heat conduction-inhibiting properties.

The outer thermal insulation 30 in the longitudinal section of the thermoelectric generator 1, along the stack direction S according to FIG. 1 preferably has substantially the geometry of a rectangle. Here two mouldings 33 form the longitudinal sides 35 of the rectangle. Two further mouldings 33 form the two transverse sides 36 of the rectangle. One of the two mouldings 33 forming a longitudinal side 35 is arranged outside on a first stack disc 2a1 facing the housing 10. The moulding forming the other longitudinal side 35 is arranged outside on a first stack disc 2b1 facing the housing 10, which is located opposite the stack disc 2a1 in stack direction S.

As is additionally evident from FIG. 1, an inner thermal insulation 31 consisting of at least one thermally insulating material is present in the insulation interior space 32 (this is not shown in FIG. 2 for the sake of clarity). The inner thermal insulation 31 serves for thermally insulating the gas paths 4 relative to the coolant paths 5 and comprises a plurality of thermal insulation elements 37. Each thermal insulation element 37 is arranged with respect to the stack direction S in one of the intermediate spaces 6 between two adjacent stack disc pairs 3. With respect to the first longitudinal extension direction $L_1$ of the housing 10 running transversely to the stack direction S, the thermal insulation elements 37 are arranged in the intermediate space 6 between a connecting gas path 13a, 13b, which connects two adjacent stack disc pairs 3, and the coolant path 5, which is adjacent to this connecting gas path 13a, 13b in the first longitudinal extension direction $L_1$. For the sake of clarity, the inner thermal insulation 31 is omitted in FIG. 2).

The thermal insulation elements 37 can be designed as mouldings which are embedded between the connecting gas paths 13a, 13b and the coolant paths 5. Preferred is a design of the mouldings as identical parts. The material of the inner thermal insulation 31, just like that of the outer thermal insulation 30, can comprise mineral fibers with fillers, which have a high temperature resistance and heat conduction-inhibiting properties. In principle, the material of the outer thermal insulation can be identical to or distinct from material of the inner thermal insulation.

As is further evident from FIG. 1, the housing 10 comprises a first housing wall 39a and a second housing wall 39b located opposite the first housing wall 39a in the stack direction S. On the first housing wall 39a, a first reinforcing plate 40a is arranged inside, i.e. in the housing interior space 11. Accordingly, a second reinforcing plate 40b is arranged on the second housing wall 39b inside, i.e. in the housing interior space 11. The material of one or both reinforcing plates 40a, 40b can be a metal. Between the first reinforcing plate 40a and the outer thermal insulation 30, and between the second reinforcing plate 40b and the outer thermal insulation 30, a preloading device 41 for exerting a preload force on the thermoelectric modules 8 is arranged.

The preloading device 41 in the exemplary scenario of FIG. 1 comprises two first preloading elements 42a, which each support themselves at one end on the first reinforcing plate 40a and at the other end on the moulding 33 of the outer thermal insulation 30, which in the longitudinal section of FIG. 3 forms one of the two longitudinal sides 35 of the rectangle 34. The preloading device 41 additionally comprises two second preloading elements 42b, which each support themselves at one end on the second reinforcing plate 40b and at the other end on the moulding 33 of the outer thermal insulation 30, which in the longitudinal section of FIG. 1 forms the other one of the two longitudinal sides 35 of the rectangle 34. In versions of the example, the number of first and second preloading elements 42a, 42b can vary. The first and second preloading elements 42a, 42b can be designed as resilient elements, for example in the form of disc springs or leaf springs.

The two first preloading elements 42a are arranged, with respect to a first lateral plane 43a, which extends perpendicularly to the stack direction S, in the region 15a of the thermoelectric modules 8. Accordingly, both second preloading elements 42b are arranged, with respect to a second lateral plane 43b, which extends perpendicularly to the stack direction S, in the region 15b of the thermoelectric modules 8.

From the representation of FIG. 1 it is evident, furthermore, that the thermoelectric generator 1 comprises a gas inlet 28a fluidically communicating with the gas paths 4 for conducting the gas into the gas paths 4. Furthermore, the thermoelectric generator 1 comprises a gas outlet 28b which likewise communicates with the gas paths 4 for conducting the gas out of the thermoelectric generator 1 once it has flowed through the gas paths 4.

Furthermore, a connection (not shown in the FIGS. 1 and 2) can also be provided on two sides of the housing located opposite in the second longitudinal extension direction $L_2$ in each case, which is designed for conducting the coolant into the coolant paths 5 and for conducting the coolant out of the coolant paths 5. The outer thermal insulation 30 in this case serves to thermally insulate the gas inlet 28a, the gas outlet 28b, of said connections for the coolant and of the preloading device 41 with the preloading elements 42a, 42b relative to the stack disc pairs 3 flowed through by the hot gas.

In the exemplary scenario, the gas inlet 28a comprises an inlet tube body 27a, which stands away from the first stack disc 2a1 facing the first reinforcing plate 40a towards the first housing wall 39a. Here, the inlet tube body 27a engages through apertures which are formed in the first reinforcing plate 40a and in the first housing wall 39a and are aligned with one another and in this way projects out of the housing 10. The gas outlet 28b accordingly comprises an outlet tube body 27b, which projects from the second stack disc 2b1 facing the second reinforcing plate 40b towards the second housing wall 39b. Here, the outlet tube body 27b engages through apertures formed in the second reinforcing plate 40b and in the second housing wall 39b and in this way projects out of the housing 10.

The invention claimed is:
1. A thermoelectric generator for a motor vehicle comprising:
a housing, wherein the housing defines a housing interior space;
an outer thermal insulation arranged in the housing interior space, wherein the outer thermal insulation at least partially envelopes an insulation interior space;
a plurality of first stack discs and a plurality of second stack discs, wherein the plurality of first stack discs and the plurality of second stack discs are alternately stacked along a stack direction within the insulation interior space, wherein the alternately stacked plurality of first stack discs and second stack discs form a plurality of stack disc pairs, wherein each of the plurality of stack disc pairs include a first stack disc and a second stack disc, and wherein the first stack disc and the second stack disc each define a gas flow path;
at least one tube body positioned within at least one intermediate space defined between at least a first stack disc pair of the plurality of stack disc pairs and a second stack disc pair of the plurality of stack disc pairs adjacent to the first stack disc pair in the stack direction, and wherein the at least one tube body defines a coolant flow path;
wherein the at least one first stack disc pair is in fluid communication with the at least one second stack disc pair via at least one connecting gas flow path;
a thermoelectric module having at least one thermoelectrically active element disposed within the at least one intermediate space between the gas flow path and the coolant flow path, wherein the thermoelectric module includes a hot side in thermal contact with the gas flow path and a cold side in thermal contact with the coolant flow path; and
an inner thermal insulation having at least one thermal insulation element disposed within the insulation interior space, wherein the inner thermal insulation is constructed and arranged to thermally insulate the gas flow path relative to the coolant flow path.
2. The thermoelectric generator according to claim 1, wherein the outer thermal insulation comprises a plurality of mouldings.
3. The thermoelectric generator according to claim 1, wherein the outer thermal insulation is a rectangular shape in a longitudinal section along the stack direction, and wherein a first moulding and a second moulding of the plurality of mouldings form a first longitudinal side and a second longitudinal side of the rectangular shape, respectively, and a third moulding and a fourth moulding of the plurality of mouldings form a first transverse side and a second transverse side of the rectangular shape, respectively.
4. The thermoelectric generator according to claim 3, wherein the first moulding and the second moulding are arranged on an outer surface of the first stack disc facing the housing and on an outer surface of the second stack disc facing the housing and located opposite of the first stack disc in the stack direction.
5. The thermoelectric generator according to claim 1, wherein the at least one thermal insulation element of the inner thermal insulation is arranged with respect to the stack direction in the intermediate space between the at least one first stack disc pair and the second stack disc pair; and
wherein the at least one thermal insulation element is arranged with respect to a first longitudinal extension direction running transversely to the stack direction between the connecting gas flow path adjacent the coolant flow path in the first longitudinal extension direction, and wherein the connecting gas flow path connects the at least first stack disc pair and the second stack disc pair and the coolant flow path.

6. The thermoelectric generator according to claim 1, wherein a material of at least one of the outer thermal insulation and the inner thermal insulation comprises mineral fibers with fillers.

7. The thermoelectric generator according to claim 1, wherein at least a first thermal insulation element and a second insulation element of the plurality of thermal insulation elements comprise a plurality of substantially identical mouldings.

8. The thermoelectric generator according to claim 1, wherein the housing includes a first housing wall and a second housing wall opposite of the first housing wall in the stack direction, wherein the thermoelectric generator further comprises a first reinforcement plate on an inner surface of the first housing wall and a second reinforcement plate on an inner surface of the second housing wall, and a preloading device interposed between at least the first reinforcing plate and the outer thermal insulation and between the second reinforcing plate and the outer thermal insulation, constructed and arranged to exert a preload force on the thermoelectric module.

9. The thermoelectric generator according to claim 8, wherein the preloading device comprises at least one of a first preloading element having a first end supported on the first reinforcing plate and a second end supported on the outer thermal insulation and a second preloading element having a first end supported on the second reinforcing plate and a second end supported on the outer thermal insulation.

10. The thermoelectric generator according to claim 9, wherein at least one of the first preloading element and the second preloading element is a resilient element.

11. The thermoelectric generator according to claim 9, wherein the first preloading element and the second preloading element are at least one of arranged perpendicularly to the stack direction in relation to a first lateral plane and perpendicularly to the stack direction in relation to a second lateral plane.

12. The thermoelectric generator according to claim 1, wherein the thermoelectric generator further comprises a gas inlet in fluid communication with the gas flow path constructed and arranged to accept a gas flow and a gas outlet in fluid communication with the gas flow path constructed and arranged to flow the gas out of the gas flow path.

13. The thermoelectric generator according to claim 12, wherein the gas inlet includes an inlet tube body, wherein the inlet tube body extends from the first stack disc and faces a first reinforcing plate towards a first housing wall through a first aperture defined in the first reinforcing plate and a second aperture defined in the first housing wall and projects a distance out of the housing, and the gas outlet includes an outlet tube body, wherein the outlet tube body extends from the second stack disc facing a second reinforcing plate towards a second housing wall through a first aperture in the second reinforcing plate and a second aperture aligned with the first aperture in the second housing wall and projects out of the housing.

14. The thermoelectric generator according to claim 2, wherein the plurality of mouldings are substantially plate-like.

15. The thermoelectric generator according to claim 9, wherein the first preloading element and the second preloading element are arranged perpendicularly to the stack direction in relation to a first lateral plane.

16. The thermoelectric generator according to claim 9, wherein the first preloading element and the second preloading element are arranged perpendicularly to the stack direction in relation to a second lateral plane.

17. The thermoelectric generator according to claim 10, wherein the resilient element is one of a disc spring and a leaf spring.

18. The thermoelectric generator according to claim 12, wherein the gas inlet includes an inlet tube body, wherein the inlet tube body extends from the first stack disc facing the first reinforcing plate towards the first housing wall through a first aperture defined in the first reinforcing plate and a second aperture defined in the first housing wall and projects a distance out of the housing.

19. The thermoelectric generator according to claim 12, wherein the gas outlet includes an outlet tube body, wherein the outlet tube body extends from the second stack disc facing the second reinforcing plate towards the second housing wall through a first aperture in the second reinforcing plate and a second aperture aligned with the first aperture in the second housing wall and projects out of the housing.

20. A thermoelectric generator for a motor vehicle comprising:
a housing, wherein the housing defines a housing interior space;
an outer thermal insulation arranged in the housing interior space, wherein the outer thermal insulation at least partially envelopes an insulation interior space, wherein the outer thermal insulation comprises a first moulding, a second moulding, a third moulding, and a fourth moulding, wherein the first moulding and the second moulding form a first longitudinal side and a second longitudinal side of a rectangular shape, respectively, and the third moulding and the fourth moulding form a first transverse side and a second transverse side of the rectangular shape, respectively;
a plurality of first stack discs and a plurality of second stack discs, wherein the plurality of first stack discs and the plurality of second stack discs are alternately stacked along a stack direction within the insulation interior space, wherein the alternately stacked plurality of first stack discs and second stack discs form a plurality of stack disc pairs, wherein each of the plurality of stack disc pairs include a first stack disc and a second stack disc, and wherein each of the first stack disc and the second stack disc define a gas flow path;
at least one tube body positioned within at least one intermediate space defined between at least a first stack disc pair of the plurality of stack disc pairs and a second stack disc pair of the plurality of stack disc pairs adjacent to the first stack disc pair in the stack direction, and wherein the at least one tube body defines a coolant flow path;
wherein the at least one first stack disc pair is in fluid communication with the at least one second stack disc pair via at least one connecting gas flow path;
a thermoelectric module having at least one thermoelectrically active element disposed within the at least one intermediate space between the gas flow path and the coolant flow path, wherein the thermoelectric module includes a hot side in thermal contact with the gas flow path and a cold side in thermal contact with the coolant flow path;
an inner thermal insulation having at least one thermal insulation element disposed within insulation interior space, wherein the inner thermal insulation is constructed and arranged to thermally insulate the gas flow path relative to the coolant flow path; and wherein at least one of the outer thermal insulation and the inner insulation comprises mineral fibers with fillers having high temperature resistance and heat conduction inhibiting properties.

* * * * *